PIEZOELECTRIC WIDE BANDPASS FILTER WITH ELLIPTICAL SHAPE

Filed Oct. 22, 1964

INVENTOR,
CHARLES W. H. BARNETT

BY: Harry M. Saragovitz,
Edward J. Kelly,
Herbert Berl &
J. P. Edgerton

United States Patent Office 3,319,193

Patented May 9, 1967

3,319,193
PIEZOELECTRIC WIDE BANDPASS FILTER WITH ELLIPTICAL SHAPE

Charles W. H. Barnett, Alexandria, Va., assignor to the United States of America as represented by the Secretary of the Army Filed Oct. 22, 1964, Ser. No. 405,878
5 Claims. (Cl. 333—72)

The invention described herein may be manufactured and used by or for the Government of the United States of America for governmental purposes without the payment to me of any royalty thereon.

This invention relates generally to electrical filters, and more specifically to ceramic piezoelectric wide bandpass filters having particular application in miniaturized communication equipment.

Since piezoelectric filters can be made to occupy a very small volume, they are well suited for use in equipment requiring miniaturized components. Furthermore, piezoelectric filters are rugged and reliable and exhibit low loss. As a result, these filters are being used to replace the conventional I.F. transformers in transistorized radio equipment. The usual bandpass characteristics of a cylindrical or disk piezoelectric filter are sharp having a width at the three decibel attenuation level between four and ten kilocycles per second in the range of 455 kilocycles per second. In cases where a broad bandpass filter is required it has been the usual practice to stack several of these filters together in a system commonly known as a ladder. By choosing the resonant frequencies so that the pass bands at the three decibel attenuation level of succeeding disk filters of the ladder are adjacent, a flat-topped bandpass filter is realized. The number of disk filters in the ladder is, of course, determined by the desired bandpass of the filter. While such filters have been generally satisfactory in the past, they suffer the disadvantages of increased cost and size in applications where larger pass bands are required.

It is therefore an object of the present invention to provide a ceramic piezoelectric filter which obtains the wide bandpass characteristics formerly obtained by stacking several piezoelectric filters.

It is another object of this invention to provide a ceramic piezoelectric wide bandpass filter which costs less to produce and occupies a smaller volume than was heretofore possible.

According to the present invention, the foregoing and other objects are attained by altering the geometric form of the ceramic piezoelectric resonators from the disk shape to an elliptical shape. The width of the bandpass of the resulting filter is dependent on the dimensions of the major and minor axes of the ellipse.

The specific nature of the invention, as well as other objects, aspects, uses and advantages thereof, will clearly appear from the following detailed description and from the accompanying drawing, in which.

The piezoelectric elements of the filter are composed of a ferroelectric material such as barium titanate which when polarized by the application of a strong electrostatic field develops properties similar to the piezoelectric effects exhibited by many naturally occurring crystalline materials such as quartz and Rochelle salt. The polarizing voltage is typically of the order of 100 volts per mil thickness of the ceramic. Ceramic piezoelectric materials, however, have certain properties which distinguish them from naturally piezoelectric materials. Because they are ceramic, they are capable of being formed into desired shapes by simple fabricating methods well known in the ceramic arts; and because they are istropic in a plane perpendicular to the axis or direction of polarization, disks of such ceramics have both an axial and a radial mode of vibration. The radial mode of vibration, which is essential to the bandpass filters according to the instant invention, does not exist as an isolated mode in naturally piezoelectric materials.

Figure 1:
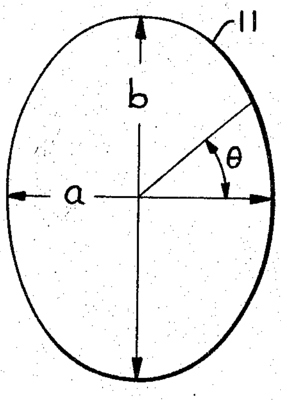
FIG. 1 is a plan view of a ceramic element used in a filter according to the invention showing the elliptical shape of the element.

Ceramic piezoelectric filters are poled in the axial direction and characterized by having a diameter which is larger than four times their thickness. The resonant frequency of the disk filter is inversely proportional to the diameter of the disk. FIG. 1 shows the elliptical shape of a ceramic element 11 used in a filter according to the invention. The element 11 has a minor axis $a$ and a major axis $b$. The radius $r$ of the element 11 is a function of the angle $\theta$ which is the angular displacement about the intersection of the major and minor axes. More specifically the radius $r$ is $$r=\sqrt{\frac{a^2b^2}{a^2 \sin^2 \theta+b^2 \cos^2 \theta}}$$

therefore, the resonant frequency $f_R$ of the element 11 when polarized is $$f_R=\frac{K}{\sqrt{\frac{a^2b^2}{a^2 \sin^2 \theta-b^2 \cos^2 \theta}}}$$

where K is a constant of proportionality. From the expression for the resonant frequency given above, it can be seen that the minor axis determines the highest resonant frequency of the element 11 while the major axis determines the lowest resonant frequency.

Figure 2:
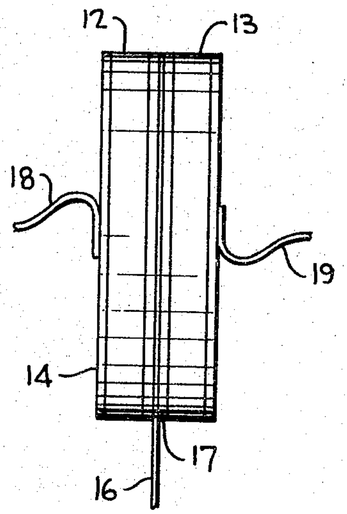
FIG. 2 is a side view of a ceramic piezoelectric wide bandpass filter constructed according to the invention.

The construction of a filter according to the invention may be best understood with reference to FIG. 2 of the drawings which shows a side view of a preferred embodiment. The filter comprises two elliptical piezoelectric elements 12 and 13 both of which are coated on one side 14 and 15, respectively, with silver which acts as electrodes. The two elements 12 and 13 are cemented together with their silver coated sides facing outwardly and having a common electrode 16 of silver foil there between them. An epoxy resin 17 filled with silver is used in cementing to provide an electrical path to the silver foil 16 as well as good mechanical connection between the piezoelectric elements 12 and 13. Electrical leads 18 and 19 are soldered to the silver coated sides 14 and 15, respectively, of the piezoelectric elements.

Figure 3:
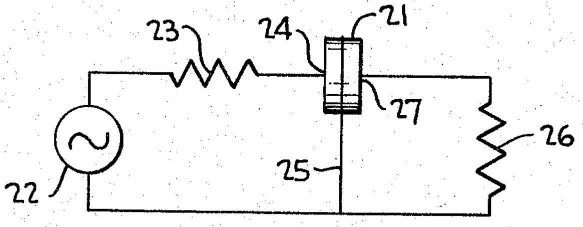
FIG. 3 is a schematic diagram showing the input and output circuits connected to the filter.

FIG. 3 illustrates the manner of connecting a filter 21 in an electrical circuit. The Thēvenin equivalent of the input circuit represented by a signal voltage source 22 and a series input impedance 23 is connected across one of the silver electrodes 24 and the common electrode 25. A generalized load impedance 26 is connected across the other silver electrode 27 and the common electrode 25. In operation, a voltage developed across the first ceramic piezoelectric element of the filter 21 by the signal voltage source 22 causes the first element to deform. This deformation is mechanically coupled to the second element of the filter by the adhesive bond between the two elements. When the second piezoelectric element is deformed, it generates a voltage signal in the output circuit thereby providing a coupling of the input signal to the output circuit in a manner analogous to that provided by the conventional I.F. transformer. Of course, very little of the input signal outside the band of resonant frequencies of the filter 21 is coupled to the output circuit because of the characteristically high mechanical Q of the filter. By properly choosing the dimension of the major and minor axes of the ceramic piezoelectric filter elements, pass bands of eighty-five kilocycles per second at a center frequency of 455 kilocycles per second are readily achieved.

It will be apparent that the embodiment shown is only exemplary and that various modifications can be made in construction and arrangement within the scope of the invention as defined in the appended claims.

I claim as my invention:

1. A wide bandpass electrical filter comprising an elliptically-shaped ferroelectric ceramic material of substantially uniform thickness and polarized to exhibit piezoelectric properties, the major axis of said elliptically-shaped material being chosen to determine the lowest resonant frequency of the filter and the minor axis of said elliptically-shaped material being chosen to determine the highest resonant frequency of the filter.

2. A wide bandpass electrical filter comprising:

(a) first and second elliptically-shaped ferroelectric ceramic materials as defined in claim 1, (b) a first electrode affixed to said first elliptically-shaped ferroelectric ceramic material, (c) a second electrode affixed to said second elliptically-shaped ferroelectric ceramic material, (d) a common electrode connected to both said first and second elliptically-shaped ferroelectric ceramic materials, and (e) means for mechanically coupling said first and second elliptically-shaped ferroelectric ceramic materials to transmit deformations of one material to the other material.

3. A wide bandpass electrical filter as defined in claim 2 wherein said means for mechanically coupling is an adhesive.

4. A wide bandpass electrical filter comprising:

(a) a first elliptically-shaped ferroelectric ceramic material of substantially uniform thickness and polarized to exhibit piezoelectric properties, (b) a second elliptically-shaped ferroelectrically ceramic material of substantially uniform thickness and polarized to exhibit piezoelectric properties, the major axes of both said elliptically-shaped materials being chosen to determine the lowest resonant frequency of the filter and the minor axes of both said elliptically-shaped materials being chosen to determine the highest resonant frequency of the filter, (c) a first metallic coating on one face of said first elliptically-shaped ferroelectric ceramic material, (d) a second metallic coating on one face of said second elliptically-shaped ferroelectric ceramic material, (e) a metallic foil sandwiched between the non-coated faces of said first and said second elliptically-shaped ferroelectric ceramic materials, and (f) an electrically conducting adhesive providing a mechanical bond between the non-coated faces of said first and said second elliptically-shaped ferroelectric ceramic materials to transmit deformations of one material to the other material and further providing an electrical bond between said metallic foil and the non-coated faces of said first and said second elliptically-shaped ferroelectric ceramic materials.

5. A wide bandpass electrical filter as defined in claim 4 wherein said electrically conducting adhesive is an epoxy resin filled with silver.

No references cited.

ROY LAKE, *Primary Examiner.*

D. R. HOSTETTER, *Assistant Examiner.*